(12) United States Patent
Natarajan et al.

(10) Patent No.: US 6,254,925 B1
(45) Date of Patent: Jul. 3, 2001

(54) SOURCE METAL EMBEDDED IN AN INERT MATERIAL AND PROCESS THEREOF

(75) Inventors: Govindarajan Natarajan, Pleasant Valley; John U. Knickerbocker, Hopewell Junction; Robert A. Rita, Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/123,928

(22) Filed: Jul. 28, 1998

(51) Int. Cl.[7] ................................................... C23C 16/06
(52) U.S. Cl. ........................ 427/124; 427/252; 427/253
(58) Field of Search ................................. 427/252, 253, 427/124

(56) References Cited

U.S. PATENT DOCUMENTS

| 4,427,720 | * | 1/1984 | Gauje . |
| 4,590,095 | | 5/1986 | Park . |
| 4,664,942 | * | 5/1987 | Park . |
| 4,971,738 | | 11/1990 | Herron et al. . |
| 5,053,361 | | 10/1991 | Herron et al. . |
| 5,139,975 | | 8/1992 | Herron et al. . |
| 5,869,134 | * | 2/1999 | Reddy et al. . |

* cited by examiner

*Primary Examiner*—Timothy Meeks
(74) *Attorney, Agent, or Firm*—Eric W. Petraske

(57) ABSTRACT

The present invention discloses at least one source metal that is embedded in at least one inert material to form a stand-alone structure and process thereof. It is preferred that the source metal is nickel or alloy thereof, and the inert material is at least one ceramic.

20 Claims, 1 Drawing Sheet

US 6,254,925 B1

SOURCE METAL EMBEDDED IN AN INERT MATERIAL AND PROCESS THEREOF

FIELD OF THE INVENTION

The present invention discloses at least one source metal that is embedded in at least one inert material to form a stand-alone structure and process thereof. It is preferred that the source metal is nickel or alloy thereof, and the inert material is at least one ceramic.

BACKGROUND OF THE INVENTION

In the electronics industry it is often desirable to cover or coat an existing refractory metal surface with a brazable or solderable surface. Applications for such a procedure, include but are not limited to, input/output (I/O) pads, wire bond pads, C4's (Controlled Collapse Chip Connection), seal bands, to name a few.

Many methods are available and practiced in the industry to cover or coat an existing refractory metal surface with a brazable or solderable surface. The most commonly used approach for treating refractory metal surfaces in the microelectronic packaging business is to employ electroplating and electroless-plating of pure or substantially pure Ni (nickel) film from an aqueous bath which is at or near room temperature.

Nickel is generally the metal of choice for plating refractory metals because it can be made to bond well with any of the refractory metals. In addition, Ni possesses good wetting characteristics for subsequent bonding processes, such as brazing or soldering, and it has excellent corrosion characteristics.

Recently, a few high temperature, dry, halide transfer processes have been disclosed and subsequently used by the industry for the purpose of plating nickel on refractory metal surfaces of electronic packages using molybdenum or tungsten.

One method disclosed in U.S. Pat. No. 4,590,095 (Park) uses a pack cementation approach. The essential elements for pack cementation are a powder metal source, an activator, and an object to be plated. Basically, the elements are placed in a chamber and the object is buried in a mixture of the powder metal source, activator, and usually an inert ceramic powder, such as, alumina, and then heated to a high temperature to establish vapor transport. The process allows for mass transfer of the gas species. For the Park process pure nickel powder was used as the metal source and the activator used was ammonium iodide.

A departure from this pack cementation approach for a halide transfer process was disclosed in U.S. Pat. No. 4,664,942 (Park). In this case ammonium iodide and pure nickel were still the essential elements for the halide transfer process. However, in this case nickel screens were used as the metal source rather than the nickel powder. And, the objects to be plated, containing exposed surfaces of refractory metal, were placed in stacks with the nickel screens acting as separators in the reaction vessel or work boat. The ammonium iodide activator for the process was held in a separate crucible within the work boat. The elements were again heated to a high temperature to establish vapor transport. The open nickel screen allowed for mass transfer of the gas species and also served as the nickel source.

Most recently, another improvement was put forward in U.S. Pat. No. 5,869,134 (Reddy et al.), filed issued Feb. 9, 1999, entitled "CVD OF METALS CAPABLE OF RECEIVING NICKEL OR ALLOYS THEREOF USING IODIDE", presently assigned to International Business Machines Corporation, and the disclosure of which is incorporated herein by reference, where CuI was disclosed as a preferred iodide activator providing various advantages.

Another improvement that has been proposed is in U.S. patent application Ser. No. 09/050,491, filed on Mar. 30, 1998, entitled "CVD OF METALS CAPABLE OF RECEIVING NICKEL OR ALLOYS THEREOF USING INERT CONTACT", presently assigned to International Business Machines Corporation, and the disclosure of which is incorporated herein by reference, where at least one inert material is in a floating contact with the receiving metal, and the inert material provides physical separation between the source metal and the receiving metal.

Dry Process (DP) nickel is basically a halide transfer process where nickel metal is transported in the gas phase from a solid nickel source and deposited as a solid metallic film on a refractory metal surface. The halide used in this case is iodide, i.e., iodide is the carrier gas. Ideally the reaction will be made to take place in a closed container which in general is not tightly sealed.

In general, for halide transfer metal deposition processes, it is very desirable that the metal source material, preferably, a substantially pure solid nickel source and the refractory metal area to be plated are kept in close physical proximity to each other. This close proximity condition is necessary in order to maintain a reasonable rate of metal deposition during the process.

In the prior art halide transfer processes, referenced above, the metal source material, powder or screens, were kept in close physical proximity to the refractory metal surface to be plated. However, in addition, due to the specific geometrical configuration of each assembly, the metal source material can at least at some point, also come into direct physical contact with the metal surface to be plated. It has been discovered that when the source metal and the target areas do touch each other, during the deposition process, while using these known processes, they, the source and the sink, can form a bond. When the nickel plated part and the other assembly materials are subsequently separated, after the deposition process has been completed, a defect in the deposited nickel film can be readily observed. This defect can take the form of a taffy pull of metal or a piece of metal debris or a missing section of the deposited nickel film, etc. This condition will normally, result in the rejection of the part or work piece.

Another improvement that has been proposed in U.S. patent application Ser. No. 09/050,490, filed on Mar. 30, 1998, entitled "CVD OF METALS CAPABLE OF RECEIVING NICKEL OR ALLOYS THEREOF USING INERT AN INERT STRUCTURE WITH EMBEDDED NICKEL OR ALLOYS THEREOF", presently assigned to International Business Machines Corporation, and the disclosure of which is incorporated herein by reference, where at least one inert structure with embedded nickel is in a floating contact with the receiving metal, and the inert material provides physical separation between the source metal and the receiving metal.

Thus there is a need for having at least one source metal that is embedded in at least one inert material to form a stand-alone structure, and to be able to use this structure in a CVD (Chemical Vapor Deposition) process where the source metal, such as, nickel or alloys thereof, such as, Ni/Cu, Ni/Co, are deposited on metal surfaces which are capable of receiving the source metal, such as, refractory metal, such as, molybdenum, tungsten or alloys thereof, using an Iodide source, preferably an Iodide salt, such as, Ammonium Iodide or Copper Iodide, where the source metal and a high strength inert material that provides separation between the source metal and the receiving metal surface are embodied in a single structure. This invention basically allows the CVD of nickel (Ni) or alloys thereof, on the surface of refractory metal, such as, molybdenum (Mo) or tungsten (W), where the nickel source is physically isolated from the refractory metal surface to be plated using at least one high strength inert material that is in physical floating contact with the refractory metal surface that needs to be coated with at least one layer of nickel or alloy thereof, and where the nickel source and the high strength inert material are embodied in a single bonded structure.

The present invention, further teaches a new material composition for the inert structure for improving the strength, porosity and hence the performance and life of these structures in the halide transfer process where nickel metal is electrolessly deposited onto a refractory metal surface. With the method of this invention the metal source and the refractory metal surface to be plated, are kept in close physical proximity, as required, to effect rapid deposition rate, but where at least one improved strength inert standoff material is in contact with the receiving metal surface and where the high strength inert standoff material embodies or is bonded or attached to the metal source in the process, such that the high strength inert standoff material and the metal source are handled conveniently as a single unit. The inert material continues to provide complete physical isolation between the source metal and the surface being plated, such that there does not exist any opportunity for the source metal and the receiving metal to touch and weld and form a bond creating a defect. However, in this present invention the source metal and the high strength inert material providing for isolation are securely bonded as a single unit, and may be referred to as high strength tile or high strength settertile.

PURPOSES AND SUMMARY OF THE INVENTION

The invention is a novel structure and process where nickel or alloys thereof, are deposited on refractory metal surfaces using a CVD (Chemical Vapor Deposition) process with Iodide, using at least one high strength inert standoff in contact with the receiving metal surface to physically isolate the nickel source, where the nickel source and the high strength inert standoff are securely bonded to each other into a single unit.

Therefore, one purpose of this invention is to provide an apparatus and a process that will provide a deposition of nickel or alloys thereof, on refractory metal surfaces with Iodide, preferably an iodide salt, as the active reagent, using at least one high strength inert standoff in contact with the receiving metal surface to physically isolate the nickel source where the inert standoff and the nickel source are securely bonded to each other.

Another, purpose of this invention is that the defects associated with source and sink contact are removed.

Yet another purpose of this invention is that high strength tiles are used to yield lower cost process.

Therefore, in one aspect this invention comprises a process for depositing at least one source metal onto at least one receiving metal on a substrate, comprising at least one source metal being secured to at least one inert material and forming a tile:

(a) placing said substrate containing said at least one receiving metal in a chamber containing at least one tile, (b) heating said chamber and its contents in a non-oxidizing environment at a temperature in the range from between about 700° C. to about 1,000° C., for a period of time ranging to a maximum of about 200 minutes, (c) allowing said chamber and its contents to cool so that said receiving metal has at least one layer of said source metal adhered thereto.

In another aspect this invention comprises a process for depositing nickel or alloys thereof on at least one receiving metal, wherein said receiving metal is securely bonded to a ceramic substrate, comprising the steps of:

(a) placing said ceramic substrate containing said receiving metal in a chamber containing at least one discrete nickel or alloy thereof and a discrete portion of at least one iodide source, and wherein at least a portion of at least one inert material is secured to said at least one discrete nickel or alloy thereof, such that there is no physical contact between said nickel or alloy thereof and said receiving metal, (b) heating said chamber and its contents in a non-oxidizing environment at a temperature in the range from between about 700° C. to about 1,000° C., for a period of time ranging to a maximum of about 200 minutes, (c) allowing said chamber and its contents to cool so that said receiving metal has at least one layer of said nickel or alloy thereof adhered thereto.

In yet another aspect this invention comprises an apparatus comprising a container containing, at least one ceramic substrate having at least one receiving metal securely bonded thereto, and at least one inert material secured to at least one source metal, and wherein said at least one inert material physically separates said at least one source metal from said at least one receiving metal.

In still yet another aspect this invention comprises a structure comprising at least one source metal secured to at least one inert material.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

This invention discloses a high temperature halide transfer reaction process providing for physical isolation between a metal source and an area for metal deposition, but concurrently maintaining a very close proximity of the two in order to allow for efficient, uniform, and timely progress of the transfer process and where the metal source and means of physical separation, typically a ceramic standoff, between the source and sink are securely bonded to each other, such that, they can be conveniently handled as a single unit, and may be referred to as high strength tile or high strength settertile.

In this invention the preferred metal to be transferred and deposited is nickel or nickel alloy. The target area to be plated with nickel is refractory metal, such as, tungsten or molybdenum, and the carrier -halide gas used is iodide. However, the intrinsic intent of the invention is directly applicable to other halide transfer processes of similar configuration.

Figure 1:
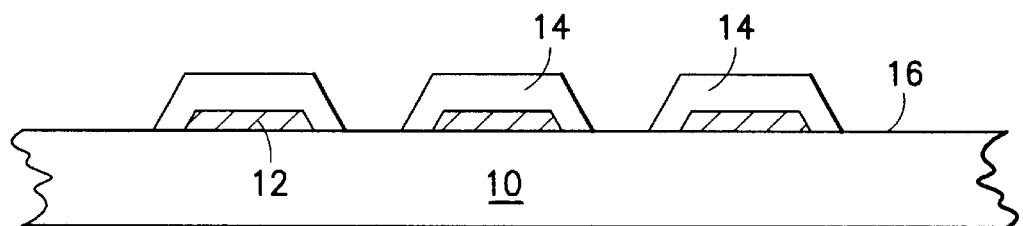
FIG. 1, illustrates a cross-sectional view of a preferred structure of this invention.

FIG. 1, illustrates a cross-sectional view of a preferred structure of this invention where a ceramic substrate 10, has at least one receiving or refractory metal 12, such as, for example, tungsten, molybdenum, etc., having at least one layer of nickel or nickel alloy 14.

Figure 2:
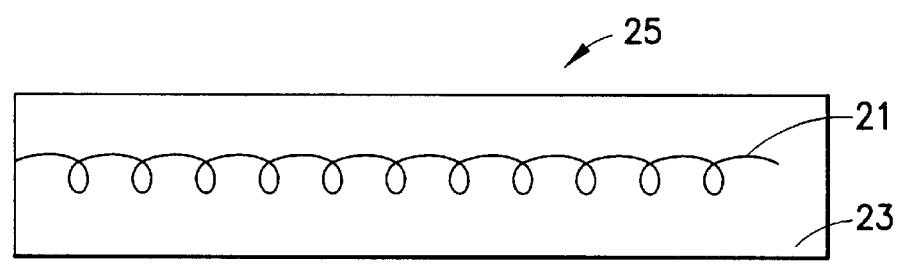
FIG. 2, illustrates a cross-sectional view of a high strength tile of this invention.

FIG. 2, illustrates a cross-sectional view of a high strength tile or high strength settertile 25, of this invention. The high strength tile 25, comprises of at least one inert standoff 23, incorporating at least one source metal material 21. Basically, the inert standoff 23, is used to physically bring the source metal material 21, as close as possible to the receiving metal 12, but at the same time physically separate the receiving metal 12, from the at least one source metal material 21.

Figure 3:
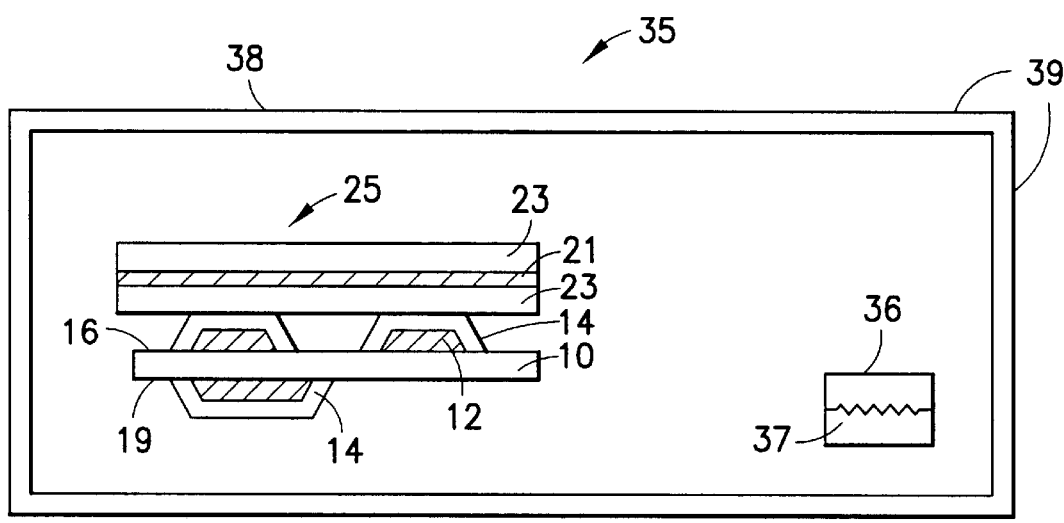
FIG. 3, illustrates a cross-sectional view of an apparatus of this invention.

FIG. 3, shows a configuration of a reaction vessel or boat 35, to be used for the halide transfer process where the metal source 25, and area to be plated 12, such as, a refractory metal pad 12, are held isolated and where the metal source 21, and the means for providing for physical isolation between the metal source 21, and the receiving metal 12, are incorporated into a single item, to form the high strength settertile or high strength tile 25.

As shown in FIG. 3, a preferred apparatus of this invention where a boat or container 35, comprising of a box or chamber 38, and at least one accessible panel 39. The box 38, has at least one crucible 36, such as, a ceramic container 36, with iodide 37, preferably a solid CuI salt 37, or solid ammonium iodide salt 37, of no specific shape, size, or configuration. There is also at least one high strength settertile or high strength tile 25, having at least one deposition metal source 21, preferably, a nickel or a nickel alloy, secured to at least one inert material 23.

It is preferred that the at least one iodide source 37, be selected from a group comprising AgI, $CoI_2$, CuI, $FeI_2$, $MnI_2$, $NH_4I$, $PbI_2$, $VI_2$, to name a few.

The ceramic body 10, has at least one receiving or refractory metal feature 12, such as, an I/O pad or wire bond pad or seal band or a line, or a terminal via, to name a few, on the first surface 16, and/or at least one receiving or refractory metal feature 12, such as, an I/O pad or wire bond pad or seal band or a line, or a terminal via, to name a few, on the second surface 19, of the ceramic substrate or body 10.

The deposition metal source 21, as shown in FIG. 2, basically, could be nickel particles 21, which are randomly distributed within the inert material 23, and which would be sufficient to assist in completing the process. Or alternatively, the metal source 21 could be a fully interconnected nickel phase, or it could also be non-uniform in nickel phase concentration in order to provide an optimum overall configuration of the high strength settertile. In addition, one could have more than one deposition metal source 21, such as, a first or upper deposition metal source 21, and a second or a lower deposition metal source 21, facing the second surface 19. For the purposes of illustration only, the deposition metal source 21, may be referred to as randomly distributed nickel particles 21.

The material for the deposition metal source 21, could be selected from a group comprising pure nickel (Ni) or Ni/cobalt or Ni/copper or alloy thereof, to name a few. The material for the deposition metal source can be of any shape, size, or configuration, including powder, however, the preferred embodiment has nickel particles which are randomly distributed throughout the high strength inert material 23.

The preferred refractory metal 12, is selected from a group comprising molybdenum, tungsten, or alloys or compounds thereof, including mixtures with other materials, such as, WC—Co.

The specific halide transfer process used to effect nickel plating could be any of several processes currently in use. However, in general the constituents of the reaction assembly, the item incorporating metal source and high strength inert standoff, activator, and surface to be plated, are built into a reaction vessel or work boat and then heated to a temperature high enough to effect a significant rate of vapor phase transport of the metal source. For the case of CuI as the activator, and nickel metal as the source to be deposited on a refractory metal surface, such as, tungsten or molybdenum, one preferred heating profile would be to heat the contents from room temperature to between about 700° C. and about 1000° C., and then to hold the deposition process at this peak temperature for a time period from between about 1 minutes to about 200 minutes.

Using this Chemical Vapor Deposition process incorporating the high strength setter or tile providing isolation and metal source, Ni and/or Ni-alloy films can be built upon the surfaces of the refractory metal 12, without defects. It has been seen that the thickness of the deposited nickel layer 14, can be from between about 0.01 microns to layer thicknesses exceeding about 10–15 microns.

However, it should be noted that no limit on particle size or particle distribution is necessary to operate this invention, as long as there is no physical contact between the source material 21, and the surface of the refractory metal 12. For most of the semiconductor microelectronic applications, it is preferred that the high strength inert particles to make up the high strength settertile, have an average particle size up to about 10 microns.

As stated earlier, that the high strength inert material 23, is basically there to prevent the physical contact between the metal receiving surface of refractory metal 12, and the source material 21.

For some applications the high strength inert material could be selected from a group comprising alumina particles, alumina fibers, zirconia, etc. with alkaline earth aluminosilicate glass compositions 1, 2 and 3.

In general terms, this invention discloses the presence of a high strength inert material with said alkaline earth aluminosilicate glasses between the source, such as, a nickel source, and the metal surface to be plated regardless as to how it is applied and/or configured so long as the high strength inert material and the metal source are securely bonded to each other such that they can be handled as a single item.

The process of this invention provides advantages over the prior art processes. Most importantly it provides a method whereby uniform metal films are deposited that are completely free of chemical or mechanical defects associated with physical contact between the metal source and the metal surface being plated in a halide transfer deposition process.

Additionally, this process provides a cost effective method of manufacturing, because the metal source material and the material providing for isolation between the metal source and the receiving metal are handled as a single unit, and the unit is reusable over an extended number of times.

Another solution would be to provide a reaction configuration where the source metal 21, and the target deposition area 12, are not able to come into direct physical contact, but that the source and sink are in close physical proximity such that the gas transfer between them is not significantly impeded. This is done, according to the present invention, by creating a structure where both the high strength inert standoff 23, and the source nickel metal 21, are integrated to form the high strength settertile 25, such that the high strength settertile 25, can be handled as a single unit.

The high strength settertile 25, provides multiple functions, first it provides and maintains the source metal 21, in close proximity to the surface of the receiving metal 12, second, it provides for physical isolation between the source metal 21, and the receiving metal 12, using a high strength inert material 23, and third, it provides for mechanical strength during multiple reuse of the high strength settertile 25. Thus the item providing for the source metal 21, also has integrated into its configuration a means for a high strength inert standoff 23, between the metal source 21, and the receiving metal 12, in the process.

The high strength settertile 25, needs to be configured such that the passage of gas between the metal source 21, and the receiving metal 12, is not significantly impeded. Gas species must be allowed to travel between the source metal 21, and the deposition surface 12, in order to effect plating. In addition, the high strength inert material 23, integrated into the high strength settertile 25, configuration needs to be non-reactive to the iodide environment and is preferably, alumina with various types of bonding glass or glass-ceramic. The preferred type of glass-ceramic additive to achieve higher strength includes the family of alumino-magnesium-silicate of various compositions whose glass transition temperature is preferably below 800 deg C.

Construction of the high strength settertile or high strength tile 25, incorporating both high strength inert standoff 23, and metal source 21, and supplying other necessary function as described above, can be done in any of several different ways.

One method is to provide the metal source 21, initially as an oxide powder. This metal oxide source powder 21, can be combined with high strength inert materials 23, in a slurry and cast as green sheet and then processed similar to producing multilayer ceramic (MLC) packages, or the metal oxide source powder 21, could be mixed with high strength inert materials 23, and subsequently dry pressed and sintered. The sinter process, should be such that the metal particles 21, are preferably interconnected and have a volume occupancy of about 50 percent, and be totally embodied within the high strength inert body 23.

Where the green sheet process is used, it is possible to control the concentration of metal oxide phase within the high strength settertile 25, by simply controlling the concentration of metal oxides 21, in the individual green sheets 23, that make up the high strength settertile 25. In this way, for example, the actual surface of the high strength settertile 25, could be either higher or lower in metal concentration 21, than the high strength settertile core depending on the specific application.

Where a dry press process is used, it would more likely be the case that the concentration of metal oxide phase in the high strength settertile 25, would be uniformly distributed throughout the volume of the high strength settertile 25.

Using either method, MLC or dry pressed, a couple of interesting options could also be used to produce the final result. For example, instead of using glass ceramic material or glass that forms glass ceramic as the high strength additive for the high strength inert material 23, as would be the preferred case with most applications, one could start with an organometallic powder containing nickel and oxides as alumino-magnesium silicate and then during sintering dissociate the species to form distinct nickel metal 21, and glass ceramic 23. This approach may possess certain processing and dimensional control advantages in certain systems.

Finally, it is possible to partially sinter the high strength settertile 25, with porosity ranging up to about 60 percent in the high strength settertile 25, greatly increasing its strength and at the same time maintaining access for the reaction gases in and out of the high strength tile 25. This approach of having a partially dense high strength settertile 25, will provide constant reaction distance between the source and the sink during the multiple reuse of the high strength settertile 25, and also allows the constant distribution of source metal 21, in the high strength inert settertile 25.

Any of the permutations of the methods for making the high strength tile 25, as discussed above could be made to appear in the final product as demonstrated as a particular case of this method in FIG. 2.

Another method for constructing the high strength settertile 25, would be to provide the metal source 21, as a thin plate or foil 21. Then one could secure, to the surface of this plate or foil 21, loose high strength inert particles 23, of appropriate size. In this way the metal plate or foil 21, will act as metal source 21, and the particles attached to its surface act as inert standoff 23.

Still another method to construct the high strength settertile 25, would be to provide the metal source 21, as a metal mesh screen or perforated metal foil 21, where the screen or foil 21, is incorporated into a thin laminate again using a green sheet process, similar to that used for constructing MLC substrates. In this case, the metal mesh screen or perforated foil 21, of appropriate dimension is laminated between the laminate core 21, and the surface green sheet 23, to form the high strength settertile 25. The solids content of the green sheet 23, could preferably be composed of all high strength inert material 23, such as, alumina with glass ceramic 23. During lamination, material could be extruded into the gaps of the screen or perforated foil 21, and thus providing for increased mechanical support. The thickness of the external green sheets 23, and the high strength settertile core can be tailored to optimize for any specific application. It is also possible to include multiple screens 21, in the high strength settertile 25, to optimize properties. Furthermore, the high strength settertile 25, will preferably be built as a mirror image between top and bottom in order to reduce distortion during sintering. The laminate should be fired in such a way so as to preserve porosity. In this way a means is provided for gaseous mass transfer in and out of the laminate so that the embodied metal mesh screen or perforated metal foil 21, is accessible to the environment during plating.

It has been found that when a nickel foil 21, is used as nickel source 21, in the dry nickel deposition process, the nickel foil 21, is more heavily etched in regions that are immediately adjacent to a refractory metal feature being plated 12. In this way the pattern of features to be plated is transferred to the surface of the nickel foil 21, being used as source. It has been further observed that when an etched nickel foil 21, is reused in the dry nickel deposition process that any existing etched pattern in the nickel foil surface can show up as a mirror image mosaic pattern in the deposited nickel film. This is an aesthetic effect only and is in general not even noticeable when the features being plated are less than between about 200 to about 300 mils in size. Most external features common to microelectronic ceramic substrates are smaller than this size. However, when a large land area of refractory metal is to be plated, as is typically required with AlN substrates, for example, used to package devices that operate at microwave frequency, then it has been seen that used nickel foil etched surface images can be transferred to the nickel film deposit, and these patterns can be very noticeable such that they constitute an aesthetic defect.

For cost purposes, and also for certain quality and reliability constraints, it is desirable that the source material 21, such as, a nickel foil 21, be used multiple times, may be as many as 20 or more times, before it is discarded. When a high strength settertile 25, is used, the transfer of the etched mosaic pattern to the deposited nickel film is greatly reduced or completely removed such that it is no longer a concern. Consequently, a previously used high strength settertile 25, containing nickel 21, can be reused to plate large land areas of refractory metal surface 12, in the dry nickel deposition process without transferring an undesirable non-uniform appearance in the deposited nickel film 14. Also higher strength settertiles 25, ensures low frequency of breakage in use and hence the reliability of process.

Several additives have been tested to promote high strength in the inert settertile 25. In some experiments up to about 30 volume percent of alkaline earth aluminosilicate glass, which consists of about 50 percent by weight silica, 3 percent alumina, rest magnesium and calcium oxides in equal ratio, named as composition 1, was added to alumina. This composition tends to crystallize during the thermal processing before the glass can achieve a sufficiently low viscosity to allow for significant local flow needed to achieve a high level of particle to particle bonding. The glass particles do soften sufficiently to allow for some neck growth at the juncture with adjacent alumina particles; but the join area is relatively small, and the joining angle tends to be sharp and not gradual; as is preferred for high strength. The mechanical or flextural strength of this composition ranges up to about 2000 psi for additive concentrations up to about 30 volume percent. The gas permeability through the porous body ranges up to about 18 liters/hour/square inch for porosity up to about 50 volume percent.

In some other experiments up to about 30 volume percent of alkaline earth aluminosilicate glass, which consists of about 55 percent by weight silica, about 21 percent alumina, about 20 percent magnesium oxide and the rest boron oxides, named as composition 2, was added to alumina. This composition tends to crystallize at higher temperature than the one previously described during the thermal processing so that the glass can develop a lower viscosity and increased flowability before crystallization renders the material rigid. One measure of this effect is the difference in the temperature between the glass transition endotherm and the crystallization exotherm observed during heating in a DTA (Differential Thermal Analysis) instrumentation. This temperature difference is greater for composition 2 than for the composition 1. Hence, the composition 2 glasses would be expected to achieve greater flow before crystallization, resulting in glass-alumina particles bond that have larger joining area and a more rounded or filleted and smoother joining angle. The microstructure analysis indicated this indeed is the case. The flextural strength of this composition ranges up to about 8000 psi for additive concentrations up to about 30 volume percent. The gas permeability through the porous body ranges up to about 16 liters/hour/square inch for porosity up to about 50 volume percent.

In yet some other experiments up to about 45 volume percent of alkaline earth aluminosilicate glass, which consists of about 54 percent by weight silica, about 21 percent alumina, about 18 percent magnesium oxide and the rest barium and boron oxides, named as composition 3, was added to alumina. This composition tends to crystallize at higher temperature than the one previously described, composition 1, during the thermal processing so that the glass can develop a lower viscosity and increased flowability before crystallization renders the material rigid. One measure of this effect is the difference in the temperature between the glass transition endotherm and the crystallization exotherm observed during heating in a DTA instrumentation. This temperature difference is greater for composition 3 than for the compositions 1 and 2. Hence, the composition 3 glasses would be expected to achieve greater flow before crystallization, resulting in glass-alumina particles bond that have larger joining area and a more rounded or filleted and smoother joining angle. The microstructure analysis indicated this indeed is the case. The mechanical or flextural strength of this composition ranges up to about 10,000 psi for additive concentrations up to about 30 volume percent and even higher above 30 percent. The gas permeability through the porous body ranges up to about 16 liters/hour/square inch for porosity up to about 50 volume percent.

For some applications it may be desirable to have high strength settertiles without any chemically active features, such as, source metal 21.

It is preferred that at least one of the source metal is selected from a group comprising nickel mesh screen, solid nickel sheet, solid nickel foil, perforated nickel sheet, a nickel lining in the chamber, nickel powder, nickel alloy mesh screen, solid nickel alloy sheet, solid nickel alloy foil, perforated nickel alloy sheet, a nickel alloy lining in the chamber, nickel alloy powder, to name a few.

It is desirable that at least one of the at least one inert material is selected from a group comprising fibrous cloth, porous ceramic tile, coked carbon paper, glass, ceramic coated metallic screen, discrete particles, discrete fibers, fibrous material, screen mesh, to name a few. It is preferred that at least one of the at least one inert material is porous and has a porosity between about 20 percent and about 99 percent. However, for some applications at least one of the at least one inert material could be selected from a group comprising ceramic particles, ceramic fibers with at least one glass joint in between the particles or the fiber.

In the preferred embodiment the non-oxidizing environment could be selected from a group comprising argon, hydrogen, nitrogen, argon plus hydrogen, argon plus nitrogen, hydrogen plus nitrogen, to name a few.

The typical thickness of the layer of source metal over the receiving metal is preferably between about 0.01 micron to about 15 microns, and more preferably between about 3 microns to about 10 microns.

As discussed elsewhere a glass joint or necking is typically formed between the inert material and the alkaline earth aluminosilicate glasses. It is preferred that the glass transition temperature for the alkaline earth aluminosilicate glasses is less than about 800° C. For most applications it has been found that the concentration of the alkaline earth aluminosilicate glasses in the tile is less than about 90 percent by volume. The preferred flexural or mechanical strength of the tile is above at least about 3,000 psi, preferably at least above about 4,000 psi, and more preferably at least above about 7,000 psi, by the addition of the alkaline earth aluminosilicate glasses. The preferred gas permeability for the tile is at least above about 9 liters/hour/square inch, preferably at least above about 12 liters/hour/square inch, and more preferably at least above about 16 liters/hour/square inch, by the addition of the alkaline earth aluminosilicate glasses.

While the present invention has been particularly described, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A process for depositing at least one source metal onto at least one receiving metal on a substrate, comprising the steps of;
   (a) placing said substrate containing said at least one receiving metal in a chamber containing said source metal and an activator;
   (b) heating said chamber and its contents in a non-oxidizing environment at a temperature in the range from between about 700° C. to about 1,000° C., for a period of time ranging to a maximum of about 200 minutes; and
   (c) allowing said chamber and its contents to cool so that said receiving metal has at least one layer of said source metal adhered thereto, wherein the improvement comprises: bonding said source metal to at least one sheet of porous inert material, thereby forming a tile, and placing said tile of porous inert material in proximity to said receiving metal such that said source metal is separated from said receiving metal by said sheet of inert material, whereby a gaseous compound containing said source metal passes through said sheet of porous inert material to said receiving metal and deposits said source metal on said receiving metal.

2. The process of claim 1, wherein at least one of said at least one source metal is nickel or an alloy thereof.

3. The process of claim 2, wherein said nickel alloy is selected from the group consisting of nickel-copper and nickel-cobalt.

4. The process of claim 1, wherein said at least one receiving metal is selected from the group consisting of molybdenum, tungsten, and alloys thereof, compounds thereof, an mixtures thereof.

5. The process of claim 1, wherein at least one of said at least one source metal is selected from the group consisting of nickel mesh screen, solid nickel sheet, solid nickel foil, perforated nickel sheet, a nickel lining in said chamber, nickel powder, nickel alloy mesh screen, solid nickel alloy sheet, solid nickel alloy foil, perforated nickel alloy sheet, a nickel alloy lining in said chamber and nickel alloy powder.

6. The process of claim 1, wherein at least one of said at least one inert material is selected from the group consisting of fibrous cloth, porous ceramic tile, coked carbon paper, glass, ceramic coated metallic screen, discrete particles, discrete fibers, fibrous material and screen mesh.

7. The process of claim 1, wherein said non-oxidizing environment is selected from the group consisting of argon, hydrogen, nitrogen, argon plus hydrogen, argon plus nitrogen, and hydrogen plus nitrogen.

8. The process of claim 1, wherein thickness of said layer of source metal over said receiving metal is between about microns to about 10 microns.

9. The process of claim 1, wherein said activator comprises at least one iodide source.

10. The process of claim 9, wherein said at least one iodide source is selected from the group consisting of AgI, $CoI_2$, $CuI$, $FeI_2$, $MnI_2$, $NH_4I$, $PbI_2$, and $VI_2$.

11. The process of claim 9, wherein said at least one iodide source is contained within at least one crucible.

12. The process of claim 1, wherein at least one of said at least one inert material is porous and has a porosity between about 20 percent and about 99 percent.

13. The process of claim 1, wherein at least one of said at least one inert material is selected from the group consisting of ceramic particles, ceramic fibers with at least one glass bonding joint in between at least some of said ceramic particles and said ceramic fibers.

14. The process of claim 13, wherein said glass bonding joint is made of alkaline earth aluminosilicate glasses, and wherein glass transition temperature for said alkaline earth aluminosilicate glasses is less than about 800° C.

15. The process of claim 13, wherein said glass bonding joint is made of alkaline earth aluminosilicate glasses, and wherein concentration of said alkaline earth aluminosilicate glasses in said tile is less than about 90 percent by volume.

16. The process of claim 13, wherein said glass bonding joint is made of alkaline earth aluminosilicate glasses, and wherein flexural strength of said tile is above at least 4,000 psi, by said addition of said alkaline earth aluminosilicate glasses.

17. The process of claim 13, wherein said glass bonding joint is made of alkaline earth aluminosilicate glasses, and wherein gas permeability of said tile is at least above about 12 liters/hour/square inch, by said addition of said alkaline earth aluminosilicate glasses.

18. The process of claim 1, wherein said inert material has an average particle size up to about 10 microns.

19. A process for depositing at least one source metal onto at least one receiving metal on a substrate, comprising the steps of:
   (a) placing said substrate containing said at least one receiving metal in a chamber containing said source metal and an activator;
   (b) heating said chamber and its contents in a non-oxidizing environment at a temperature in the range from between about 700° C. to about 1,000° C., for a period of time ranging to a maximum of about 200 minutes; and
   (c) allowing said chamber and its contents to cool so that said receiving metal has at least one layer of said source metal adhered thereto, wherein the improvement comprises:
   bonding said source metal to at least one sheet of porous inert material, thereby forming a tile, and placing said tile of porous inert material in proximity to said receiving metal such that said source metal is separated from said receiving metal by said sheet of inert material, whereby a gaseous compound containing said source metal passes through said sheet of porous inert material to said receiving metal and deposits said source metal on said receiving metal; and
   wherein at least one of said at least one inert material is selected from the group consisting of ceramic particles, ceramic fibers with at least one glass bonding joint in between at least some of said particles and said fibers and wherein said glass bonding joint is made of alkaline earth aluminosilicate glasses.

20. A process for depositing nickel or alloys thereof on at least one receiving metal, wherein said receiving metal is securely bonded to a ceramic substrate, comprising the steps of:

(a) placing said ceramic substrate containing said receiving metal in a chamber containing at least one discrete nickel or alloy thereof and a discrete portion of at least one iodide source, and wherein at least a portion of at least one inert material is secured to said at least one discrete nickel or alloy thereof such that there is no physical contact between said nickel or alloy thereof and said receiving metal, (b) heating said chamber and its contents in a non-oxidizing environment at a temperature in the range from between about 700° C. to about 1,000° C., for a period of time ranging to a maximum of about 200 minutes, and (c) allowing said chamber and its contents to cool so that said receiving metal has at least one layer of said nickel or alloy thereof adhered thereto, wherein at least one of said at least one inert material is selected from the group consisting of ceramic particles, ceramic fibers with at least one glass bonding joint in between said particles and said fiber, said glass bonding joint being made of alkaline earth aluminosilicate glasses.

* * * * *